US009461441B2

(12) United States Patent  
Chantre et al.

(10) Patent No.: US 9,461,441 B2  
(45) Date of Patent: Oct. 4, 2016

(54) INTEGRATED HYBRID LASER SOURCE COMPATIBLE WITH A SILICON TECHNOLOGY PLATFORM, AND FABRICATION PROCESS

(71) Applicants: STMICROELECTRONICS SA, Montrouge (FR); STMICROELECTRONICS (CROLLES 2) SAS, Crolles (FR)

(72) Inventors: Alain Chantre, Seyssins (FR); Charles Baudot, Lumbin (FR); Sébastien Cremer, Sassenage (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 14/945,859

(22) Filed: Nov. 19, 2015

(65) Prior Publication Data

US 2016/0233641 A1 Aug. 11, 2016

(30) Foreign Application Priority Data

Feb. 9, 2015 (FR) ..................................... 15 50990

(51) Int. Cl.
*H01S 5/00* (2006.01)
*H01S 5/026* (2006.01)
(Continued)

(52) U.S. Cl.
CPC ............... *H01S 5/026* (2013.01); *H01S 5/021* (2013.01); *H01S 5/0264* (2013.01);
(Continued)

(58) Field of Classification Search
CPC .. H01S 5/0268; H01S 5/0267; H01S 5/0265; H01S 5/0264; H01S 5/026; H01S 5/2206; H01S 5/021; H01S 5/125; H01S 5/0656
USPC ............ 372/50.11, 50.21, 50.22, 50.23, 50.1
See application file for complete search history.

(56) References Cited

U.S. PATENT DOCUMENTS

| 4,309,670 | A | * | 1/1982 | Burnham | ............... | B82Y 20/00 372/46.01 |
| 5,956,362 | A | * | 9/1999 | Yokogawa | ............ | B82Y 20/00 372/46.01 |
| 6,628,854 | B1 | | 9/2003 | Koh | | |
| 2005/0220386 | A1 | * | 10/2005 | Nakada | .................... | G02B 6/42 385/1 |

(Continued)

FOREIGN PATENT DOCUMENTS

FR 3007589 A1 12/2014

OTHER PUBLICATIONS

J.L. Polleux et al., An SiGe/Si Heterojunction Phototransistor for Opto-Microwave Applications: Modeling and first Experimental Results, 11th GAAS Symposium—Munich 2003, pp. 231-234.

*Primary Examiner* — Kinam Park
(74) *Attorney, Agent, or Firm* — Allen, Dyer, Doppelt, Milbrath & Gilchrist, P.A.

(57) ABSTRACT

A photonic integrated circuit includes a first insulating region encapsulating at least one metallization level, a second insulating region at least partially encapsulating a gain medium of a laser source, and a stacked structure placed between the two insulating regions. The stacked structure includes a first polycrystalline or single-crystal silicon layer, a second polycrystalline or single-crystal silicon layer, an intermediate layer optically compatible with the wavelength of the laser source and selectively etchable relative to silicon and that separates the first layer from a first portion of the second layer, and the gain medium facing at least one portion of the first layer. The first layer, the intermediate layer, and the first portion of the second layer form an assembly containing a resonant cavity and a waveguide, which are optically coupled to the gain medium, and a second portion of the second layer containing at least one other photonic component.

20 Claims, 7 Drawing Sheets

(51) Int. Cl.
  *H01S 5/125* (2006.01)
  *H01S 5/22* (2006.01)
  *H01S 5/02* (2006.01)
  *H01S 5/065* (2006.01)

(52) U.S. Cl.
  CPC .......... *H01S 5/0265* (2013.01); *H01S 5/0267* (2013.01); *H01S 5/0268* (2013.01); *H01S 5/0656* (2013.01); *H01S 5/125* (2013.01); *H01S 5/22* (2013.01); *H01S 5/2206* (2013.01)

(56) References Cited

U.S. PATENT DOCUMENTS

2011/0073989 A1   3/2011  Rong
2013/0015850 A1*  1/2013  Lindorfer ............. G01R 33/032
                                                      324/244
2014/0044391 A1*  2/2014  Iizuka .................... G02B 6/131
                                                      385/14
2014/0376857 A1* 12/2014  Chantre ............. G02B 6/12002
                                                      385/14

\* cited by examiner

INTEGRATED HYBRID LASER SOURCE
COMPATIBLE WITH A SILICON
TECHNOLOGY PLATFORM, AND
FABRICATION PROCESS

TECHNICAL FIELD

The present disclosure relates to integrated circuits, and, more particularly, to photonic integrated circuits incorporating a laser source and one or more other photonic components such as, for example, waveguides, optical modulators, optical couplers, photodetectors, etc.

BACKGROUND

At the present time, there are active or passive optical devices, for example, coupling structures, waveguides, modulators and photodetectors, that may be integrated into photonic integrated circuits.

Moreover, another known advantageous component is a hybrid III-V/Si laser source. Such a laser source comprises a gain medium including a III-V composite semiconductor, a waveguide located in a subjacent silicon layer and optically coupled to the gain medium and a resonant cavity optically coupled to the waveguide and, for example, comprising Bragg mirrors. The gain medium, when it is excited (pumped) with electrical power, emits light, and the resonant cavity is intended, via interaction with the gain medium, to amplify this light so as to deliver the laser beam.

Depending on the type of laser (DBR (distributed Bragg reflector) laser or DFB (distributed feedback) laser), the Bragg mirrors are located in the silicon on the periphery of the gain medium or under the gain medium.

Such a hybrid laser source may require the distance between the gain medium and the subjacent "waveguide/resonant cavity" assembly, which is made of silicon, to be very small, typically no more than about one hundred nanometers. Moreover, the molecular bonding of the gain medium to such an assembly of the silicon-on-insulator type may require a flat surface prepared by a step of chemical-mechanical polishing.

At the present time it is known how to produce an individual III-V hybrid laser source on a silicon substrate in the laboratory.

Moreover, a photonic integrated circuit integrating a hybrid III-V on silicon (III-V/Si) laser source is described in a French patent application published under the number 3,007,589. Conventionally, for photonic integrated circuits intended for wavelengths ranging from 1310 nm to 1550 nm, it may be preferable to have a silicon layer that is not too thick, typically smaller than or equal to 300 nm in thickness, in order not to compromise the operational effectiveness of the silicon photonic components contained therein, whereas a thicker silicon layer, typically 500 nm in thickness, is necessary to form, facing the III-V/Si hybrid laser, a waveguide optically coupled to the latter, in order to pass light effectively from the resonant cavity of the laser to a silicon photonic component.

Provision is thus made to place the gain medium of the laser source on an additional thickness of silicon. This additional thickness may be a layer of amorphous silicon separated from the subjacent silicon layer (especially containing the other photonic components) by a layer of silicon dioxide.

However, amorphous silicon is a relatively unstable material and this may lead to degradation of the reliability and performance of the laser source. Moreover, it is difficult to form an amorphous silicon layer of uniform thickness on the scale of an entire wafer.

Furthermore, it is not easy to integrate the use of amorphous silicon into the steps currently used in CMOS fabrication processes.

SUMMARY

According to one method of implementation and embodiment, provision is made for a photonic integrated circuit and a fabrication process effectively integrating a III-V/Si hybrid laser source having better properties, especially in terms of performance and reliability, while being compatible with the conventional steps of a CMOS fabrication process.

According to one aspect, provision is made for a photonic integrated circuit having a first insulating region encapsulating at least one metallization level, a second insulating region at least partially encapsulating the gain medium of a laser source, typically a III-V/Si hybrid laser source, and a stacked structure placed between the two insulating regions.

The stacked structure may include a first polycrystalline or single-crystal silicon layer, having for example a thickness of about 200 nanometers, and a second polycrystalline or single-crystal silicon layer, having for example a thickness of about 300 nanometers.

The stacked structure moreover includes an intermediate layer that is optically compatible with the wavelength of the laser source and that is selectively etchable relative to silicon, this intermediate layer separating the first layer from a first portion of the second layer.

Moreover, the gain medium faces at least one portion of the first layer.

Furthermore, the first layer, the intermediate layer and the first portion of the second layer may form an assembly containing a resonant cavity and a waveguide, which are optically coupled to the gain medium.

Moreover, a second portion of the second layer may include at least one other photonic component.

Thus, whereas the second layer, i.e. the layer that especially comprises the one or more other photonic components, is formed from polycrystalline or single-crystal silicon, the additional thickness of silicon placed under the gain medium of the laser source, and especially allowing the resonant cavity (typically the Bragg mirrors) to be formed, is here formed from a first silicon layer that may be polycrystalline or single-crystal. There is therefore no need here to use amorphous silicon.

Moreover, the first layer and the first portion of the second layer are separated by an intermediate layer that is selectively etchable relative to silicon.

This thus makes it possible to more easily delimit using selective etching operations, the first silicon layer relative to the second silicon layer, while allowing the presence of this intermediate layer within the assembly to be limited, thereby preventing the intermediate layer from creating an additional thickness on the second portion of the second layer so as not to compromise the operational effectiveness of the other photonic components.

Moreover, when a layer is said to be optically compatible with the wavelength of the laser source, what is meant is that the optical absorption coefficient of the layer is low enough not to degrade the performance of the laser source, especially in terms of optical power.

A person of ordinary skill in the art will be able to choose the properties of this intermediate layer so that it meets, depending on the application, the aforementioned optical compatibility and selective "etchability" requirements.

This being so, it would appear, by way of indication, that whatever the wavelength of the laser source, an intermediate layer having an optical absorption coefficient lower than 50 $cm^{-1}$ allows the aforementioned optical compatibility criterion to be met.

However, it is preferable for the optical absorption coefficient to be lower than or equal to 20 $cm^{-1}$.

By way of indication, it is possible to use silicon dioxide or indeed a silicon-germanium alloy as the material of the intermediate layer.

Although it is functionally possible to use polycrystalline silicon for the first and second layer, with for example silicon dioxide as the material of the intermediate layer, it is preferable, in order to further improve the performance of the laser source, to use single-crystal silicon for both the first and second layer.

It is in this case that the use for the intermediate layer of a silicon-germanium alloy is most advantageous. Specifically, it then becomes particularly simpler to preserve the single-crystal nature of the first layer, because epitaxial growth of silicon-germanium on the single-crystal silicon second layer then allows a single-crystal silicon first layer to be grown epitaxially so as to obtain an additional thickness of single-crystal silicon under the gain medium of the laser source.

The percentage x of germanium atoms in the $Si_xGe_{1-x}$ silicon-germanium alloy has an influence on absorption coefficient and etching selectivity relative to silicon.

Thus, the higher the percentage of germanium, the better the etching selectivity. In contrast, a high percentage of germanium has a negative effect on optical absorption coefficient at a given wavelength.

A person of ordinary skill in the art will be able to adjust the percentage x of germanium atoms in the alloy so as to obtain a good compromise between the optical absorption coefficient at the desired wavelength and a good etching selectivity.

The optical absorption coefficient as a function of x and the etching selectivity relative to x of silicon-germanium are well known to those skilled in the art. The latter may especially refer, as regards to variation of an optical absorption coefficient as a function of the percentage x of germanium atoms, to the article by J L. Polleux et al. entitled "An SiGe/Si Heterojunction Phototransistor for Opto-Microwave Applications: Modeling and first Experimental Results", 11th GAAS Symposium—Munich 2003.

Thus, for a wavelength of 1550 nanometers, the optical absorption coefficient remains extremely low up to 40% germanium. In contrast, for a wavelength of 1310 nanometers, it is preferable not to exceed 30% germanium.

Therefore, it is preferable to choose an $Si_xGe_{1-x}$ silicon-germanium alloy in which x is between 0.6 and 0.8, which corresponds to a germanium percentage between 20% and 40%.

Such a range allows the aforementioned optical compatibility and etching selectivity criteria to be met.

The thickness of the intermediate layer may also have an influence. Specifically, it is preferable for the thickness of silicon-germanium on the subjacent single-crystal silicon not to be too large so as to guarantee the stability of the structure, and for the germanium content not to be too high as this adversely affects optical absorption coefficient. This being so, it is desirable to have enough of a thickness in order to allow the silicon-germanium alloy to be correctly etched selectively relative to the silicon.

Here again, a person of ordinary skill in the art will be able to adjust the thickness of the intermediate layer depending on the envisaged application and the desired performance.

This being so, by way of indication, an intermediate layer thickness comprised between 10 nanometers and 40 nanometers is a good compromise.

Moreover, when the wavelength of the laser source is equal to 1310 nanometers, and if a silicon-germanium alloy is used, it is advantageous to use an $Si_{0.7}Ge_{0.3}$ alloy with an intermediate layer thickness equal to 10 nanometers.

The waveguide associated with the laser source extends into the assembly, i.e. into the first layer, the intermediate layer and the subjacent portion of the second layer, whereas, depending on the type of laser (DBR or DFB laser), the resonant cavity contained in the first layer comprises Bragg mirrors that are placed exterior to the gain medium, typically on its periphery, or indeed under the gain medium.

Although it is functionally possible for the gain medium to make direct contact with the subjacent first silicon layer, it is preferable for reasons regarding the fabrication process, for the gain medium of the laser source to be separated from the first layer by an insulating material typically having a thickness smaller than or equal to 100 nanometers.

In other words, in this case the second insulating region also extends between the gain medium and the first layer.

According to another aspect, provision is made for a process for fabricating a photonic integrated circuit, that may include producing, above a carrier, a stack having an initial layer of polycrystalline or single-crystal silicon and a second layer of polycrystalline or single-crystal silicon, the layers being mutually separated by a separating layer that is optically compatible with the wavelength of a laser source and selectively etchable relative to silicon; and producing, in the second layer, at least one portion of a waveguide and at least one other photonic component. The method may also include producing, facing the second layer, a first insulating region encapsulating at least one metallization level; removing the carrier; and producing the laser source.

Producing the laser source may include producing, in the stack, a stacked structure comprising (i) a first layer formed by a portion of the initial layer, (ii) the second layer, and (iii) an intermediate layer formed by a portion of the separating layer and separating the first layer from a first portion of the second layer. The first layer, the intermediate layer and the first portion of the second layer form an assembly containing a resonant cavity and the entirety of the waveguide. The method may also include encapsulating at least the gain medium of this laser source, which medium is optically coupled to the assembly, in a second insulating region located opposite the first insulating region relative to the stacked structure.

According to one method of implementation, producing the stack includes epitaxial growth of a layer of a $Si_xGe_{1-x}$ silicon-germanium alloy, so as to form the separating layer on a single-crystal silicon film of a silicon-on-insulator substrate, the silicon film forming the initial layer, and epitaxial growth of single-crystal silicon on the separating layer so as to form the second layer.

According to one method of implementation, producing the waveguide and at least one other photonic component may include partial etching of the second layer in first locations of this second layer; and in second locations of this second layer etching right through the second layer followed by etching of the separating layer, by partial etching of the initial layer and by filling of the etched orifices with an insulating material so as to obtain isolating zones.

According to one method of implementation, producing the stacked structure including at least the gain medium includes etching the initial layer using the isolating zones as a stop, so as to form the assembly and leave behind a remnant of initial layer above the separating layer and exterior to the assembly, then etching of the remnant of initial layer and of subjacent portions of separating layer.

According to one method of implementation, encapsulating the gain medium includes covering the stacked structure with an insulating material, forming above the insulating material an etched semiconductor heterostructure forming the gain medium and depositing another insulating layer above the insulating material and the heterostructure so as to form the second insulating region.

BRIEF DESCRIPTION OF THE DRAWINGS

Other advantages and features of the invention will become apparent on examining the detailed description of completely nonlimiting methods of implementation and embodiments, and the appended drawings in which.

DETAILED DESCRIPTION

Figure 1:
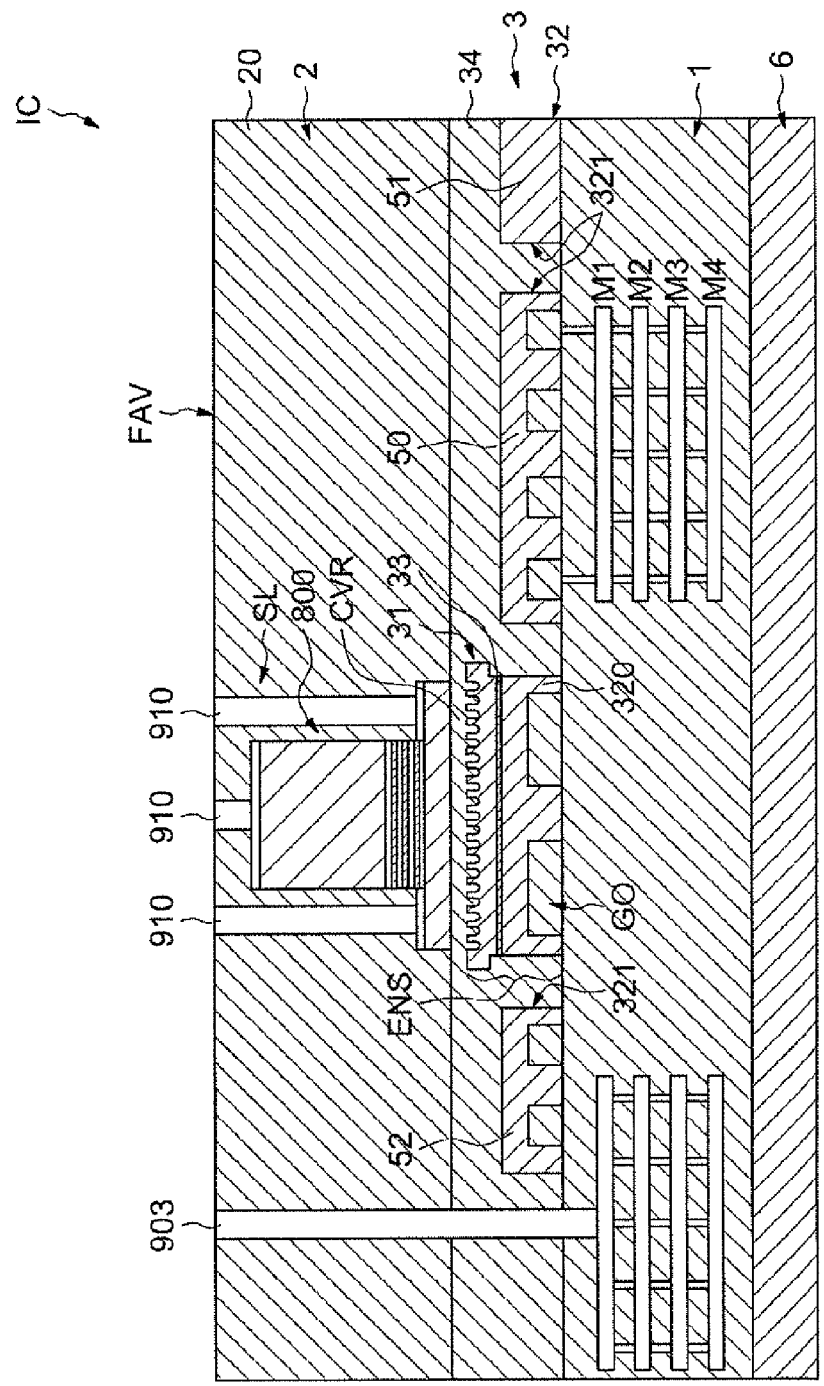
FIG. 1 schematically illustrates a photonic integrated circuit according to the invention.

In FIG. 1, the reference IC designates an integrated circuit or photonic chip comprising a first insulating region 1 encapsulating a plurality of metallization levels M1-M4.

The insulating material forming this first insulating region 1 is commonly referred to as an intermetal dielectric (IMD) by those skilled in the art.

The photonic integrated circuit IC moreover comprises a second insulating region 2 here completely encapsulating the gain medium 800 of a III-V/Si hybrid laser source referenced SL.

The integrated circuit IC also comprises a stacked structure 3 placed between the two insulating regions 1 and 2.

On account of the small thicknesses of the insulating regions 1 and 2 and of the stacked structure 3, the insulating region 1 is supported by a handle substrate 6 that provides the integrated circuit with structural rigidity.

This stacked structure 3 comprises a first silicon layer 31, here a layer of single-crystal silicon, a second silicon layer 32, here a layer of single-crystal silicon, and an intermediate layer 33.

This intermediate layer 33 is a layer that is optically compatible with the wavelength of the laser source, which is assumed in this example to be equal to 1310 nanometers, and that is selectively etchable relative to silicon.

The intermediate layer 33 separates the first layer 31 from a first portion 320 of the second layer 32.

The gain medium 800 of the laser source SL faces a portion of the first layer 31.

The first layer 31, the intermediate layer 33 and the first portion 320 of the second layer 32 here form an assembly ENS containing a resonant cavity CVR and a waveguide GO, which are optically coupled to the gain medium 800.

Moreover, the second portion 321 of the second layer 32 here contains a plurality of other photonic components (illustrated very schematically) such as, for example, a modulator 50, another waveguide 52 and a network coupler 51, these examples not forming an exhaustive list. Of course, depending on the envisaged application, only certain of these components may be produced.

The components of the second layer 32 are encapsulated in an insulating material, silicon dioxide for example. A portion of this insulating layer 34 forms, with the layer 20 partially encapsulating the gain medium 800 of the laser source SL, the second insulating region 2.

The free side of this insulating region 2 forms, after finishing steps, a front side FAV of the integrated circuit IC, on account of the presence on the other side of the handle substrate 6, even though, as will be described in more detail below, the laser source is integrated from the back side of the waveguide GO.

The integrated circuit IC moreover comprises contacts 910 making contact with eutectic zones (which are for example gold-based) of the laser source and connecting them to contact pads located on the front side FAV (not shown here for the sake of simplicity).

The photonic integrated circuit IC may also comprise other contacts 903 so as to connect buried metal tracks to other contact pads located on the front side.

The intermediate layer 33 is formed in this assembly from a $Si_xGe_{1-x}$ silicon-germanium alloy where x=0.7, corresponding to 30% germanium atoms in the alloy. The optical absorption coefficient for the wavelength 1310 nanometers is then about 20 cm$^{-1}$.

The thickness of this layer 33 is 10 nanometers.

Figure 2:
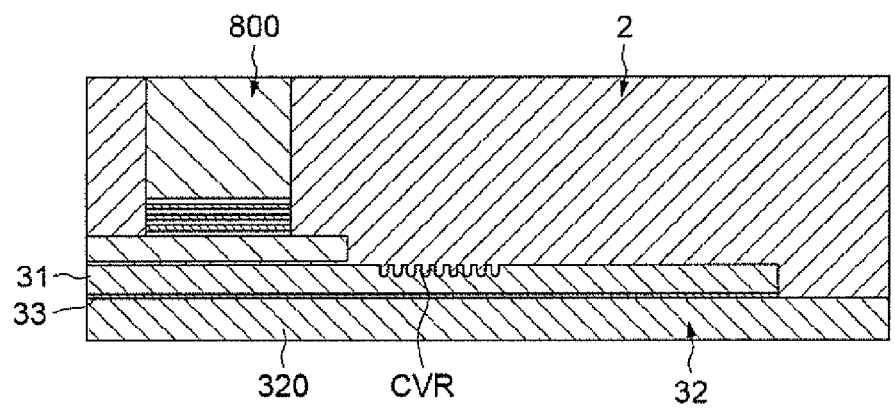
FIG. 2 is a first cross section of the photonic integrated circuit of FIG. 1.
Figure 3:
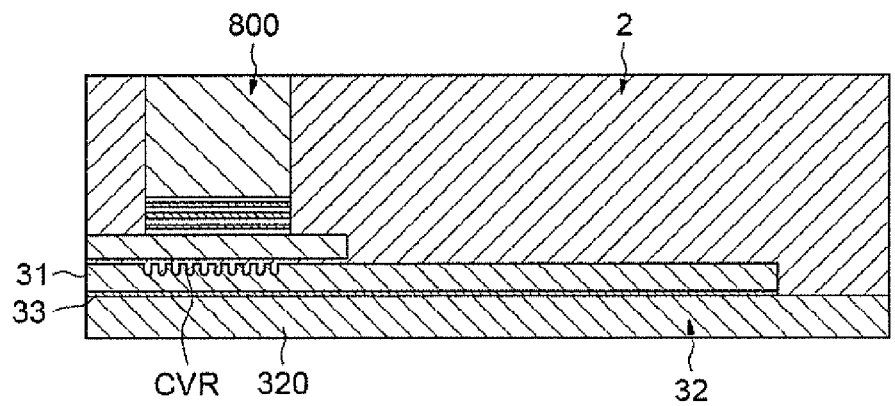
FIG. 3 is a second cross section of the photonic integrated circuit of FIG. 1.

In FIG. 1, the Bragg mirrors of the resonant cavity CVR have been represented by teeth. This has been done for the sake of simplicity in order to illustrate the presence of these Bragg mirrors. However, in practice, the edges of the Bragg mirrors are located in the plane parallel to the plane of the figure. This is illustrated in the two longitudinal cross sections in FIGS. 2 and 3, taken along the direction D (FIG. 1).

It may be seen in these two figures that the Bragg mirrors of the resonant cavity CVR may be located exterior to and typically on the periphery of the gain medium 800 (FIG. 2), this being the case for a DBR laser, or indeed under the gain medium 800 (FIG. 3), this being the case for a DFB laser.

Reference is now more particularly made to FIGS. 4 to 14 which illustrate an exemplary process for fabricating a photonic integrated circuit from a silicon-on-insulator (SOI) wafer.

Figure 4:
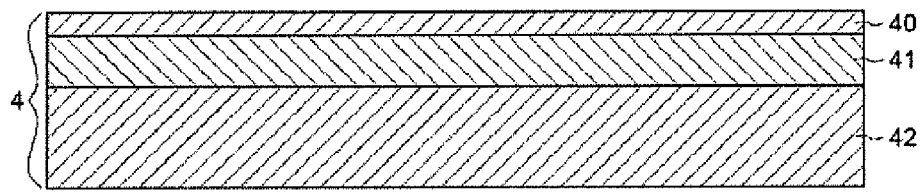
FIG. 4 schematically illustrates silicon-on-insulator in a step of an exemplary process for fabricating the photonic integrated circuit according to the invention.

FIG. 4 illustrates the silicon-on-insulator substrate, which comprises a single-crystal silicon film 40, here having a thickness of 200 nanometers, supported by a buried insulating layer 41 (commonly referred to as a BOX (Buried Oxide) by those skilled in the art), itself supported by a carrier substrate 42 made of silicon.

The single-crystal silicon film 40 forms an initial single-crystal silicon layer.

Figure 5:
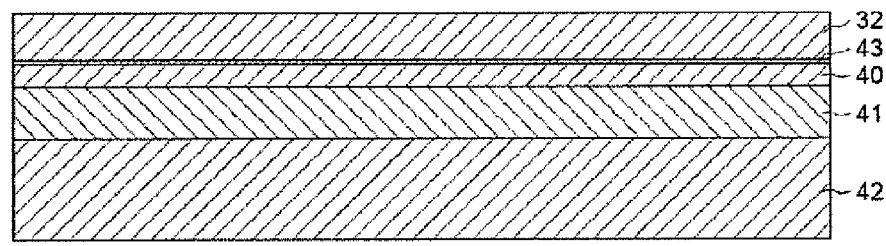
FIG. 5 schematically illustrates silicon-germanium layer epitaxially grown in a step for fabricating the photonic integrated circuit according to the invention.

Next, as illustrated in FIG. 5, silicon-germanium is epitaxially grown on the initial layer 40 so as to form a separating layer 43. The thickness of this layer 43 is here equal to 10 nanometers and the silicon-germanium alloy is a $Si_{0.7}Ge_{0.3}$ alloy.

Next, single-crystal silicon is epitaxially grown so as to form a second silicon layer 32 here having a thickness of 300 nanometers.

These epitaxial growth steps are conventional steps known per se by those skilled in the art. They are easily integrated into CMOS or BiCMOS fabrication processes and allow layers having a controlled uniformity and thickness to be obtained.

At this stage, a stack comprising the single-crystal silicon initial layer 40, the silicon-germanium separating layer 43 and the single-crystal silicon second layer 32 has been produced.

This stack is supported by a carrier, here comprising the buried insulating region 41 (BOX) and the carrier substrate 42.

Figure 6:
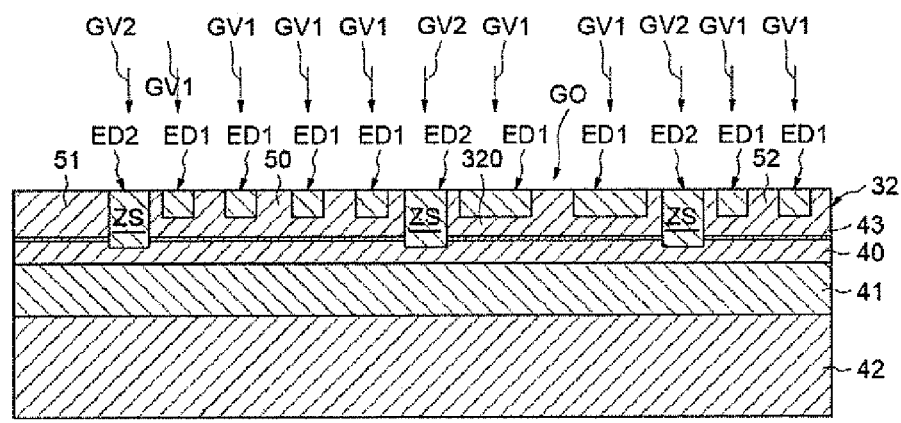
FIG. 6 schematically illustrates etching in a step for fabricating the photonic integrated circuit according to the invention.

Next, as illustrated in FIG. 6, after a resist mask has been produced, the second layer 32 is partially etched GV1 in first locations ED1 so as to produce the various components present in this layer 32, namely the waveguide GO, the modulator 50 and the waveguide 52, etc.

This etching GV1 is conventional plasma etching the duration of which is here chosen so that a thickness of about 150 nanometers of silicon is etched.

In second locations ED2 of the second layer 32, etching operations GV2 comprising etching right through the second layer 32 followed by etching of the separating layer 43 followed by partial etching of the initial layer 40 are also carried out. Here again, these etching operations GV2 are conventional and known per se and they are temporally calibrated so as to etch to a depth of 350 nanometers, which results in etching of the initial layer 40 to a depth of about 40 nanometers.

Next, silicon dioxide is deposited so as to fill the etched orifices, then a chemical-mechanical polish is carried out so as to obtain the structure illustrated in FIG. 6.

The deepest orifices (trenches for example) i.e. those that were obtained by the etching operations GV2, therefore allow isolating zones ZS to be obtained that run into the initial layer 40 and allow the various photonic components to be isolated from one another.

As will be seen in more detail below, the fact that these isolating zones ZS run into the initial layer 40 slightly is an advantageous feature as regards the rest of the process.

Figure 7:
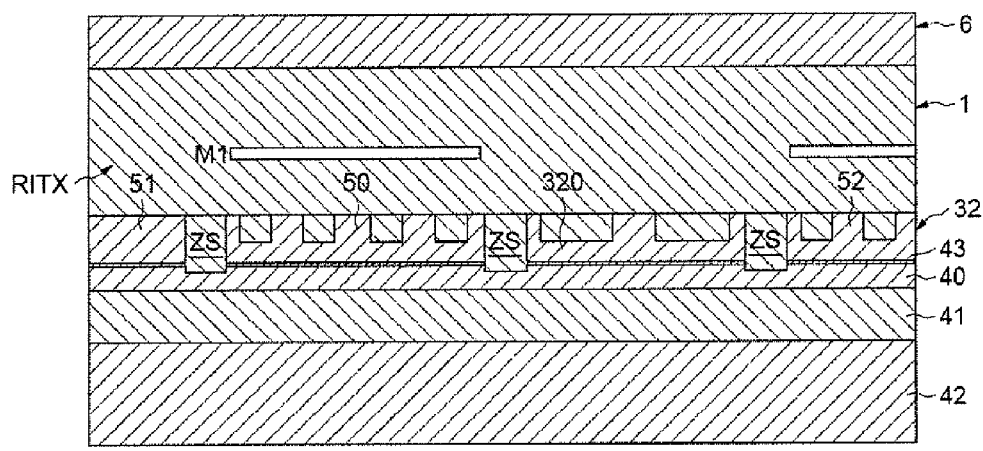
FIG. 7 schematically illustrates various metal track in a step for fabricating the photonic integrated circuit according to the invention.

In FIG. 7, a back end of line (BEOL) interconnect region comprising the various metallization levels is produced (in this figure and the following, a single metallization level M1 has been shown for the sake of simplicity), each metallization level comprising various metal tracks embedded in the intermetal dielectric. Production of this region is conventionally based on deposition and chemical-mechanical polishing (CMP) of a dielectric (oxide) and metals (copper).

At least certain of the tracks produced in these metallization levels may be connected by vias. These metallization levels are, as indicated above, typically used to interconnect components and to connect them to external contact pads.

The height of this interconnect region RITX is typically about 3 microns.

Next, a substrate 6 serving as a handle is bonded to the upper side of the insulating region 1.

Figure 8:
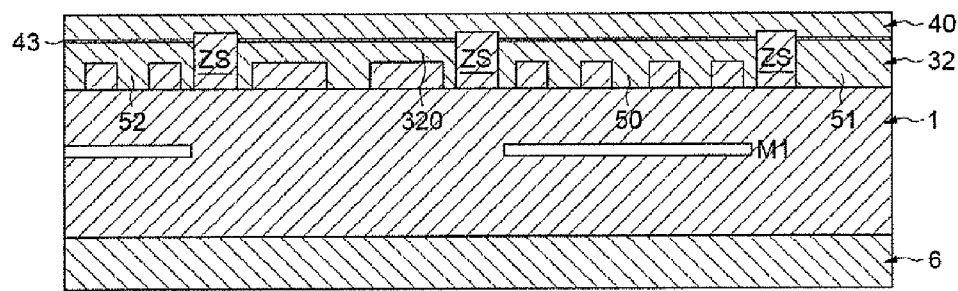
FIG. 8 schematically illustrates a carrier substrate being removed in a step for fabricating the photonic integrated circuit according to the invention.

Next, after the structure has been flipped, the carrier substrate 42 is removed, as illustrated in FIG. 8, typically by grinding followed by wet etching until the buried insulating layer 41 (BOX) is reached. Next, this layer 41 is removed, typically by a conventional wet etching operation stopped on the initial layer 40.

A free surface having a very good flatness is thus obtained for this initial layer 40.

Figure 9:
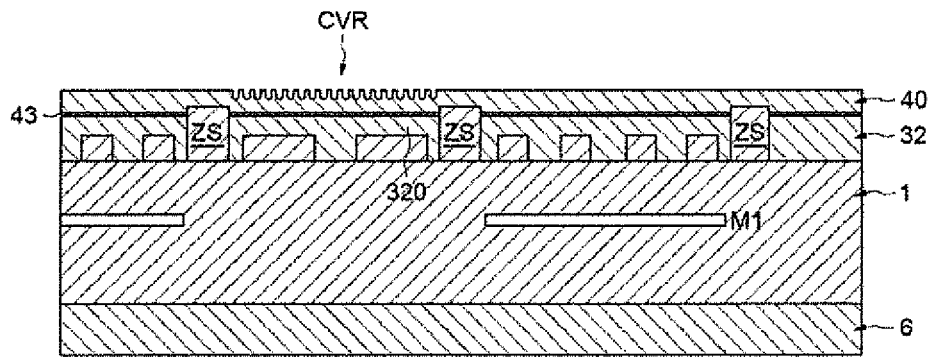
FIG. 9 schematically illustrates defining the Bragg mirrors in a step for fabricating the photonic integrated circuit according to the invention.
Figure 10:
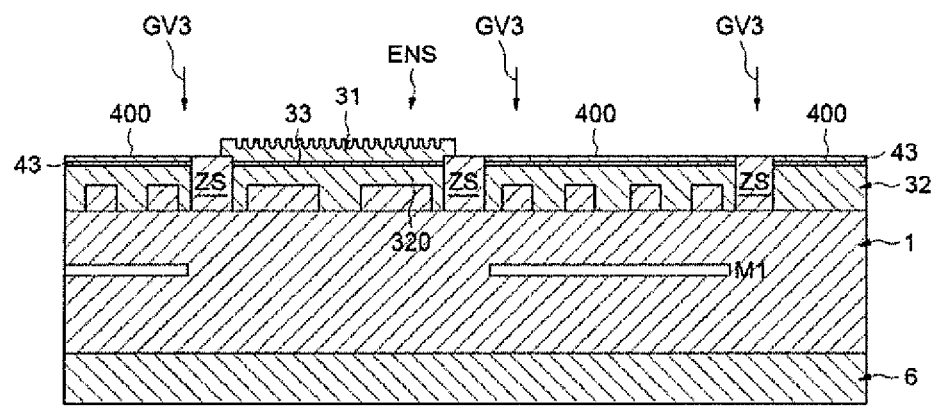
FIG. 10 schematically illustrates the geometry of the first layer a step for fabricating the photonic integrated circuit according to the invention.

As illustrated in FIG. 9, the Bragg mirrors of the resonant cavity CVR are defined, this being achieved by conventional silicon etching typically to a depth of about 10 nanometers for a DBR laser and of about 100 nanometers for a DFB laser.

Next, (FIG. 10) the geometry of the first layer 31 is defined, this being achieved first by anisotropic ion etching GV3 stopped with the back side of the isolating zones ZS.

The fact that the isolating zones ZS run into the initial layer 40 slightly thus allows here said assembly ENS to be formed while leaving behind a remnant 400 of initial layer above the separating layer 43. This has the advantage of preventing the silicon-germanium layer and above all the second layer 32 from being damaged despite the aggressive nature of the anisotropic ion etching GV3.

Figure 11:
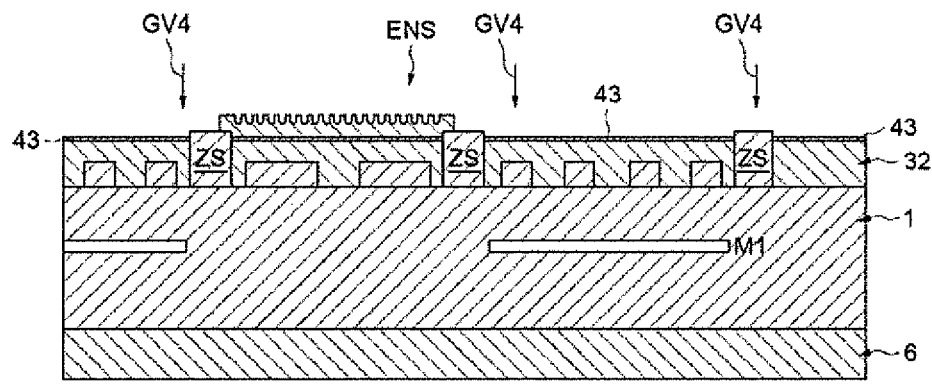
FIG. 11 schematically illustrates etching of the silicon remnant in a step for fabricating the photonic integrated circuit according to the invention.
Figure 12:
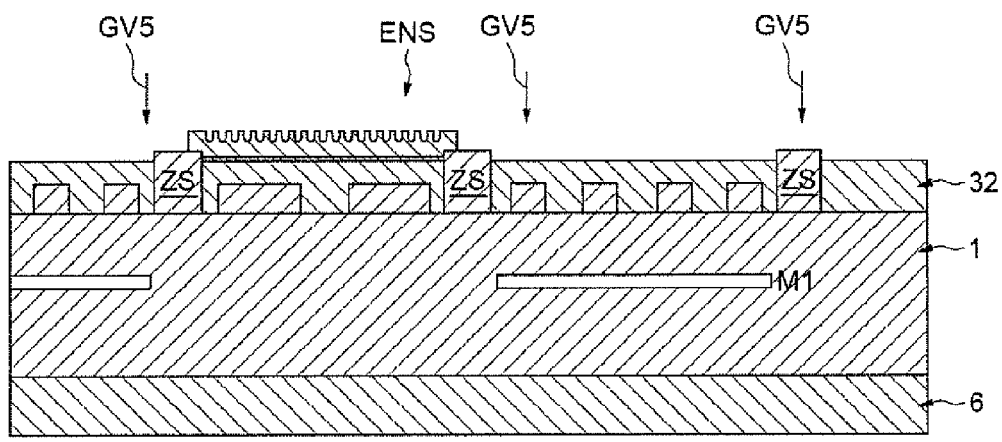
FIG. 12 schematically illustrates selective etching in a step for fabricating the photonic integrated circuit according to the invention.
Figure 13:
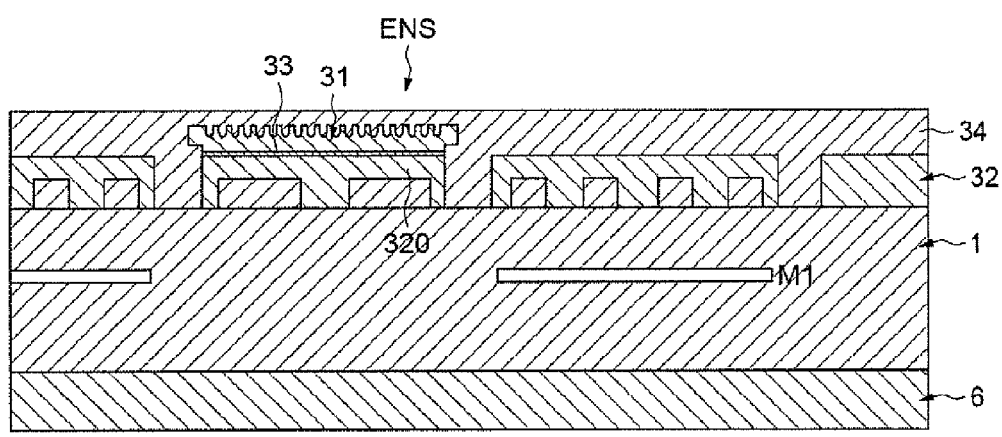
FIG. 13 schematically illustrates silicon dioxide being deposited in a step for fabricating the photonic integrated circuit according to the invention.

Next, as illustrated in FIG. 11, the etching of the silicon remnant 400 is continued but this time using a selective isotropic etching process GV4 that has a more pronounced chemical nature and that therefore is gentler.

Next, the remnant 43 of the separating layer is removed by selective etching GV5 (FIG. 12) so as to expose the untouched upper side of the second layer 32.

Next, (FIG. 13) silicon dioxide is deposited and then a chemical-mechanical polish is carried out so as to obtain the insulating layer 34, which covers very slightly the upper side of the first layer 31.

Figure 14:
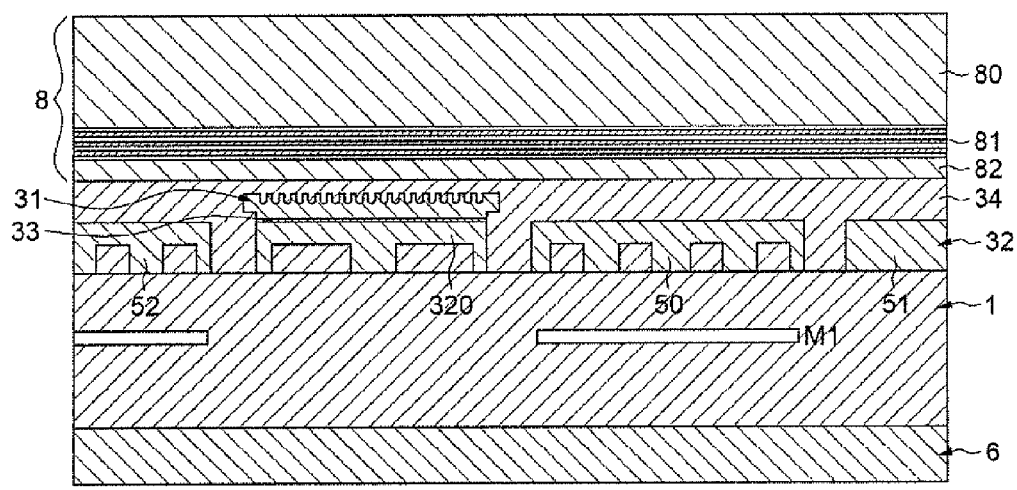
FIG. 14 schematically illustrates that a heterostructure is formed in a step for fabricating the photonic integrated circuit according to the invention.

A heterostructure 8 formed from III-V semiconductor materials is then formed, as illustrated in FIG. 14. This heterostructure is for example formed by molecular bonding of a wafer 8 formed by a III-V heterostructure.

More precisely, the heterostructure 8 here comprises a substrate 80 comprising a p-type semiconductor, for example InP, a stack 81 of layers forming quantum wells, for example of InGaAsP, and lastly a layer 82 of an n-type material, for example an InP/InGaAs stack.

The thickness of the heterostructure 8 is typically about several hundred microns.

The thickness of the stack of quantum wells 81 is about 30 nm and the thickness of the layer 82 is about 200 nm.

Next, the substrate 80 is etched with a chemical etch that is selective relative to the active layers 81 and 82, then steps of lithography and etching adapted to the III-V materials are carried out so as to obtain the gain medium 800 of the laser source (FIG. 1).

Next, eutectic deposits, which are gold-based for example, are deposited so as to allow the metal contacts 910 (FIG. 1) to be formed.

Next, this structure is encapsulated by depositing the insulating layer 20 (FIG. 1) so as to form the second insulating region 2.

Next, contacts 910 and 903 are produced in the conventional way.

After steps of finishing and cutting the wafer in order to singulate the integrated circuits, a photonic integrated circuit IC of the same type as that illustrated in FIG. 1 is obtained.

The invention is not limited to the methods of implementation and embodiments described above but encompasses all the variants thereof.

The stack of the initial layer 40, of the separating layer 43 and of the second layer 32, illustrated in FIG. 5, can be obtained in a different way.

More precisely, it is possible to start with an SOI substrate the silicon film of which is this time 300 nm in thickness.

Next, the silicon-germanium layer followed by 200 nm of silicon are grown epitaxially.

A handle substrate is then bonded to the latter 200 nm-thick layer and then this structure is flipped and the buried oxide layer (BOX) and the initial carrier substrate are removed so as to obtain the structure in FIG. 5 with the thick 300 nm layer on top.

Moreover, instead of using a silicon-germanium separating layer, silicon dioxide could be used to separate two polycrystalline silicon layers, the silicon dioxide layer being obtained by deposition and likewise the upper (300 nm-thick) polycrystalline silicon layer.

The invention claimed is:

1. A photonic integrated circuit comprising:
    at least one metallization level;
    a first insulating region encapsulating the at least one metallization level;
    a gain medium of a laser source;
    a second insulating region at least partially encapsulating the gain medium; and
    a stacked structure placed between the first and second insulating regions and comprising
        a first layer comprising polycrystalline or single-crystal silicon,
        a second layer comprising polycrystalline or single-crystal silicon, and
        an intermediate layer optically compatible with a wavelength of the laser source and selectively etchable relative to silicon and that separates the first layer from a first portion of the second layer, said gain medium facing at least one portion of the first layer,
        the first layer, the intermediate layer and the first portion of the second layer defining an assembly comprising a resonant cavity and a waveguide, which are optically coupled to said gain medium, and
        the second layer having a second portion comprising at least one other photonic component.

2. The photonic integrated circuit according to claim 1, wherein the intermediate layer has an optical absorption coefficient lower than 50 cm$^{-1}$.

3. The photonic integrated circuit according to claim 1, wherein the first layer and the second layer comprise single-crystal silicon, and the intermediate layer comprises an $Si_xGe_{1-x}$ silicon-germanium alloy.

4. The photonic integrated circuit according to claim 3, wherein x is between 0.6 and 0.8.

5. The photonic integrated circuit according to claim 3, the intermediate layer has a thickness of between 10 nm and 40 nm.

6. The photonic integrated circuit according to claim 3, wherein the laser source has a wavelength of 1310 nm, the silicon-germanium alloy is an $Si_{0.7}Ge_{0.3}$ alloy and has a thickness of 10 nm.

7. The photonic integrated circuit according to claim 1, wherein the second layer has a thickness of 300 nm and the first layer has a thickness of 200 nm.

8. The photonic integrated circuit according to claim 1, wherein the resonant cavity comprises Bragg mirrors under the gain medium.

9. The photonic integrated circuit according to claim 1, wherein the resonant cavity comprises Bragg mirrors exterior to the gain medium.

10. The photonic integrated circuit according to claim 1, wherein the second insulating region extends between the gain medium and the first layer.

11. A photonic integrated circuit comprising:
    at least one metallization level;
    a first insulating region encapsulating the at least one metallization level;
    a gain medium of a laser source;
    a second insulating region at least partially encapsulating the gain medium; and
    a stacked structure placed between the first and second insulating regions and comprising
        a first layer comprising silicon,
        a second layer comprising silicon, and
        an intermediate layer that separates the first layer from
            a first portion of the second layer, said gain medium facing at least one portion of the first layer,
            the first layer, the intermediate layer and the first portion of the second layer defining an assembly comprising a resonant cavity and a waveguide, which are optically coupled to said gain medium, and
        the second layer having a second portion comprising at least one other photonic component.

12. The photonic integrated circuit according to claim 11, wherein the first layer and the second layer comprise single-crystal silicon, and the intermediate layer comprises an $Si_xGe_{1-x}$ silicon-germanium alloy.

13. The photonic integrated circuit according to claim 12, wherein x is between 0.6 and 0.8.

14. The photonic integrated circuit according to claim 11, wherein the resonant cavity comprises Bragg mirrors under the gain medium.

15. The photonic integrated circuit according to claim 11, wherein the resonant cavity comprises Bragg mirrors exterior to the gain medium.

16. The photonic integrated circuit according to claim 11, wherein the second insulating region extends between the gain medium and the first layer.

17. A process for fabricating a photonic integrated circuit, comprising:
    forming, above a carrier, a stack comprising an initial layer of polycrystalline or single-crystal silicon and a second layer of polycrystalline or single-crystal silicon, the initial and second layers being mutually separated by a separating layer optically compatible with a wavelength of a laser source and selectively etchable relative to silicon;

forming, in the second layer, at least one portion of a waveguide and at least one other photonic component;

forming, facing the second layer, a first insulating region encapsulating at least one metallization level;

removing the carrier; and forming the laser source comprising
- forming in the stack a stacked structure comprising a first layer formed by a portion of the initial layer, the second layer and an intermediate layer formed by a portion of the separating layer and separating the first layer from a first portion of the second layer,
- the first layer, the intermediate layer and the first portion of the second layer forming an assembly containing a resonant cavity and the waveguide, and
- encapsulating at least a gain medium of the laser source, wherein the gain medium is optically coupled to the assembly, in a second insulating region located opposite the first insulating region relative to the stacked structure.

18. The process according to claim 17, wherein producing the stack comprises epitaxial growth of a layer of an $Si_xGe_{1-x}$ silicon-germanium alloy to form the separating layer on a single-crystal silicon film of a silicon-on-insulator substrate, the single-crystal silicon film forming the initial layer, and epitaxial growth of single-crystal silicon on the separating layer to form the second layer.

19. The process according to claim 17, wherein producing at least one portion of a waveguide and at least one other photonic component comprises:
- partial etching of the second layer in first locations of the second layer; and
- in second locations of the second layer, etching through the second layer followed by etching of the separating layer, by partial etching of the initial layer and by filling of etched orifices with an insulating material to form isolating zones; and
- producing the stacked structure comprises etching the initial layer using the isolating zones as a stop to form the assembly and leave behind a remnant of the initial layer above the separating layer and exterior to the assembly, and etching of the remnant of the initial layer and of subjacent portions of separating layer.

20. The process according to claim 17, wherein encapsulating at least the gain medium comprises covering the stacked structure with an insulating material, forming above the insulating material an etched semiconductor heterostructure forming the gain medium and depositing another insulating layer above the insulating material and the heterostructure to form the second insulating region.

* * * * *